Jan. 31, 1967 JAMES E. WEBB 3,301,315
ADMINISTRATOR OF THE NATIONAL AERONAUTICS AND SPACE ADMINISTRATION
THERMAL CONDUCTIVE CONNECTION AND METHOD OF MAKING SAME
Filed March 12, 1965
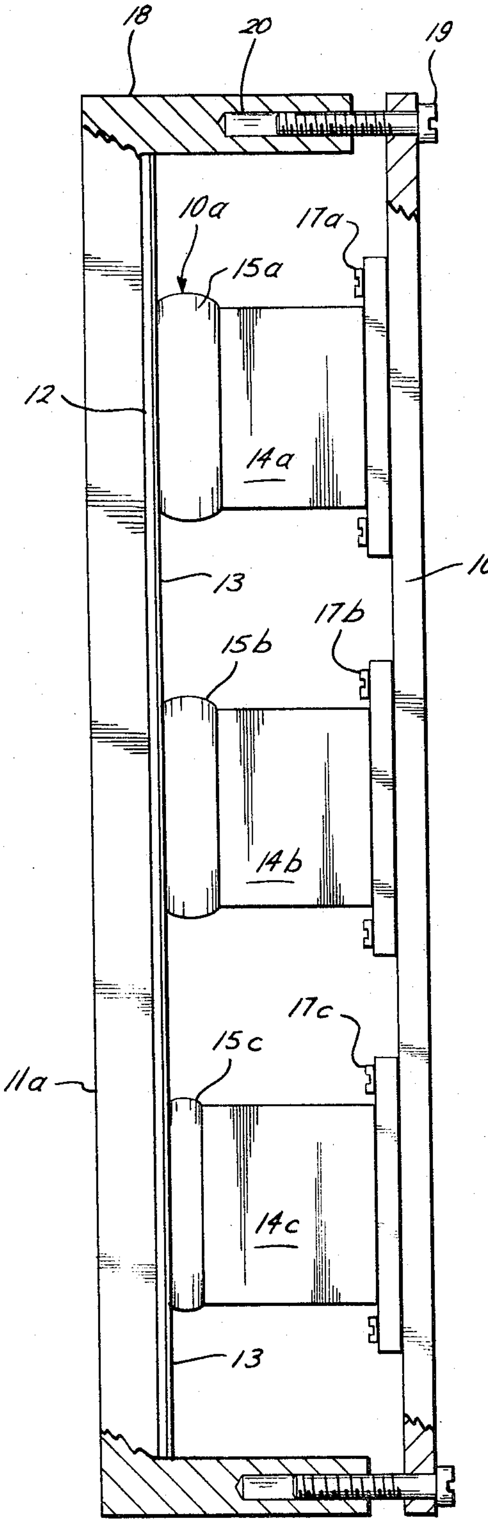
Fig. 2
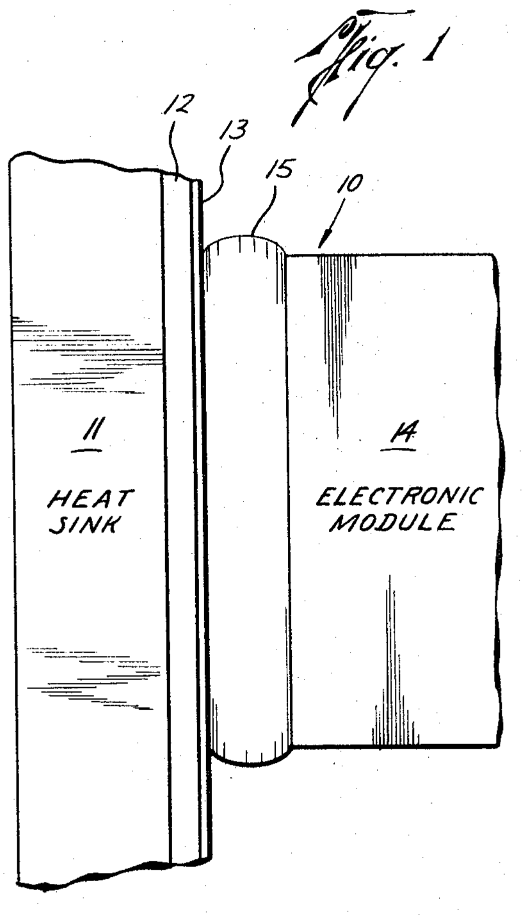
Paul E. Woodie
Paul J. Kiefer, Jr
Charles W. Wyble
Charle A. Harper
INVENTORS
BY [signature]
Marvin F. Matthews
ATTORNEYS United States Patent Office 3,301,315

Patented Jan. 31, 1967

3,301,315

THERMAL CONDUCTIVE CONNECTION AND METHOD OF MAKING SAME

James E. Webb, Administrator of the National Aeronautics and Space Administration with respect to an invention of Paul E. Woodie, Paul J. Kiefer, Jr., Charles W. Wyble and Charles A. Harper Filed Mar. 12, 1965, Ser. No. 439,489

7 Claims. (Cl. 165—1)

The invention described herein may be manufactured and used by or for the Government of the United States of America for governmental purposes without the payment of any royalties thereon or therefor.

This invention relates to a thermal conducting connection and the method of making same, and more particularly relates to an electrically insulated cleavable adhesive connection between an electronic module and a heat sink used for cooling the module.

In modern aviation and space vehicles, intricate and highly sophisticated electronic systems are employed to carry out a wide variety of functions. These systems comprise several thousand small components, each of which is vital to the successful operation of the entire system. To facilitate final assembly and to aid in the quick repair of these systems after they have been installed, several of these small or minute components are now grouped into "black boxes" or modules. It can easily be seen that through the use of modules rather than individual components, the number of necessary check points in a system is accordingly reduced, and therefore any faulty component within the system can be quickly located and replaced.

However, when several electronic components are grouped in close proximity such as in a module, large amounts of heat can be generated in the normal operation of the module, especially if the heat is not dissipated by convection or radiation. Since this heat affects the proper functioning of the components, some means for cooling the individual modules must be provided within the system. One very practical way to cool these modules is to join them to a metal heat sink which conducts the heat away from the modules to some low temperature area where it is dissipated. In order for such a cooling means to efficiently operate, a connection must be provided between the modules and the heat sink which will not only readily conduct heat, but which can be easily separated in the event it becomes necessary to replace a faulty module. Also, if the modules have a metallic outer coating, some means must be provided between the modules and the heat sink to act as an electrical insulator for the module. This is necessary when the components within the modules are sensitive to electromagnetic radiation that may exist or develop in the system.

In the past, various types of connections have been proposed, but none have proved entirely satisfactory since they were either poor heat conductors, or, if they were good heat conductors, they were extremely difficult to separate when repair was necessary. One such proposal involved the use of a thermal conductive adhesive to bond the module to the heat sink. This provided an adequate thermal conducting connection, but it was found that this connection could not be readily separated when replacement of the module was required.

The present invention provides a connection and a method of making same which allows the joining of a heat producing element and a heat sink wherein a thermal conducting union is formed between the two which can be readily separated when desired. This cleavable connection is formed by coating the heat sink with a layer of plastic material, applying a thermal conductive grease to the plastic layer, and bonding the heat producing body to the grease with a layer of thermal conductive adhesive. The grease layer forms a cleavage plane which allows easy separation when desired. Further, by varying the amounts of adhesive used, this connection allows heat producing elements of different sizes which are mounted on a single panel to be joined to a unitary heat sink without the need for expensive adaptors. In the case where the heat producing elements are delicate electronic components such as the above mentioned modules, the layer of plastic in the present invention provides the necessary electrical insulation between the module and the heat sink.

The invention will be better understood by referring to the drawings in which like numbers identify like parts in the different figures and in which:

FIG. 1 is an elevated detailed view of the thermal conducting connection made in accordance with the present invention with the heat sink and module being broken away, and with the relative thickness of each of the components of the connection highly exaggerated to clearly show the invention.

FIG. 2 is an elevated view, partly in cross-section, showing a plurality of connections made in accordance with the present invention used to join modules of different depths to a common heat sink.

The connection 10 of the present invention is formed by first coating a strip, plate, or other shape of metal 11 which is to be used as the heat sink with a thin layer 12 of a high molecular weight resin-type plastic such as polymerized halogenated ethylenes, e.g., polytetrafluoroethylene (commonly known as Teflon), or any other film-forming coating which does not bond to the below mentioned adhesive material, and which will not decompose in a space environment. The heat sink can be formed from any good heat conductive metal such as aluminum. The resin-type plastic is sprayed onto heat sink 11 from a liquid dispersion, and is allowed to set or harden before use. The final thickness of this plastic layer is approximately 0.001 inch after it is set and ready for use. It is noted that the thicknesses of the components in connection 10 have been highly exaggerated in the figures for the sake of clarity.

After the plastic has set, a layer of conductive low vapor pressure, hydrocarbon grease is applied to plastic layer 12 and then wiped off, leaving only a thin residual layer 13 of grease remaining on layer 12. This layer is preferably less than 0.001 inch thick, although it is not necessary to quantitatively control this thickness. The purpose of this grease layer 13 will be explained below. A grease known commercially as "Apiezon H," distributed by the Shell Company, is an example of the type of grease which can be used, however it should be understood that any grease having good high vacuum and thermal properties can be used without departing from the present invention.

Next an adhesive having a high concentration of silica, or other high thermal conductive filler, is applied to the heat producing element or module 14. A typical example of an adhesive having the desired characteristics is one comprised of: (1) 190 parts by weight of 325 mesh silica, (2) 34 parts by weight of epoxy resin, and (3) 100 parts by weight of polyamide resin catalyst. A typical resin is Shell Epon 828, and a typical polyamide is General Mills Versamid 140. Module 14, with a generous amount of adhesive 15 applied thereto, is then positioned onto grease layer 13. By use of suitable fixtures (not shown), module 14 and heat sink 11 are held together so that adhesive 15, grease 13, and plastic 12 form a good bonding relationship therebetween. Any excess adhesive that may be present is squeezed out of the connection and then cleaned away.

The fixture position is maintained until the adhesive is cured and the connection is secure.

Since the adhesive bonds directly to the module with no air gap, and since the plastic bonds directly onto the heat sink with no air gap, and since the grease fills any existing air gaps which may exist between the plastic and the adhesive, the connection 10 provides excellent heat conduction between the module and the heat sink. Also, the resin-type plastic layer 12 acts as an electrical insulator between module 14 and heat sink 11. When it is desirable to separate the module from the heat sink, this can readily be done by breaking the connection along the cleavage plane created by the minute layer of grease 13. This small layer of grease, although having good thermal conductivity, weakens the bonding of the adhesive to the plastic layer so that when a breaking pressure is applied, cleavage occurs along the grease layer 13.

Connections made in accordance with the present invention can also be used to join modules of different lengths to a common heat sink. As seen in FIG. 2, modules 14*a*, 14*b*, 14*c* are all of different lengths. Each of the modules is connected to a printed circuit board 16 by screws 17*a*, 17*b*, and 17*c*, respectively, or any other suitable means. The heat sink 11*a* has upstanding portions 18 at each end thereof.

To join the modules to the heat sink, the inside portion of heat sink 11*a* is first spray-coated with a resin-type plastic 12, such as Teflon, and then a layer of grease is applied thereto and wiped off, leaving only a residue layer of grease 13 thereon. Next a liberal amount of adhesive 15*a*, 15*b*, 15*c* is applied to the backs of each module 14*a*, 14*b*, 14*c*, respectively, and board 16 with the modules attached is positioned onto grease layer 13 on heat sink 11*a*. Screws 19 are then threaded into holes 20 in portions 18 of the heat sink to draw board 16 and heat sink 11*a* together. This compresses the adhesive to bond the modules to the heat sink. It should be obvious that greater amounts of excess adhesive will be squeezed from between module 14*a* and heat sink 11*a* than from between module 14*c* and heat sink 11*a*. This is due to the difference in lengths of the two modules. It can clearly be seen that although each of the modules is different in length, a good uniform connection 10*a*, 10*b*, 10*c* will be formed between the modules and the common heat sink 11*a*, due to the compensating thicknesses of layers 15*a*, 15*b*, and 15*c*.

While the invention has been described with reference to particular detailed embodiments thereof, it should be understood that modifications, substitutions, and the like may be made without departing from the spirit of the invention and the scope of the appended claims.

What is claimed and desired to be secured by Letters Patent is:

1. A cleavable, thermal conductive connection for coupling a heat producing body to a heat sink comprising:

- a layer of high molecular weight plastic bonded directly to said heat sink;
- a layer of thermal conductive, low vapor pressure, hydrocarbon grease positioned on said plastic layer; and
- a layer of thermal conductive adhesive bonded directly to said grease on one side and to said heat producing body on the other.

2. A cleavable, thermal conductive connection as set forth in claim 1 wherein the high molecular weight plastic is polytetrafluoroethylene.

3. A cleavable, thermal conductive connection as set forth in claim 1 wherein the thermal conductive adhesive comprises a mixture of silica, epoxy resin, and polyamide resin catalyst.

4. A method of forming a cleavable, thermal conductive connection between a heat producing body and a heat sink comprising:

- coating said heat sink with a relatively thin layer of high molecular weight plastic;
- applying a thermal conductive, low vapor pressure, hydrocarbon grease on said plastic layer;
- removing the excess grease so that only a relatively thin residual layer of grease remains on said plastic layer;
- applying a layer of unset, thermal conductive adhesive to the heat producing body;
- positioning the heat sink with said plastic and grease layer thereon in abutting relationship with the heat producing body with said adhesive thereon so that said adhesive and said grease layers are in direct contact; and
- allowing said adhesive to set to effect a readily separable thermal connection between the heat producing body and the heat sink.

5. A method of forming a cleavable, thermal conductive connection as set forth in claim 4 wherein the high molecular weight plastic is polytetrafluoroethylene.

6. A method of forming a cleavable, thermal conductive connection as set forth in claim 4 wherein the thermal conductive adhesive comprises a mixture of silica, epoxy resin, and polyamide resin catalyst.

7. A method of individually coupling heat producing bodies which are of different lengths and which are mounted on a common support to a unitary heat sink comprising:

- coating the heat sink with a relatively thin layer of high molecular weight plastic;
- applying a thermal conductive, low vapor pressure, hydrocarbon grease on said plastic layer;
- removing the excess grease so that only a relatively thin, residual layer of grease remains on said plastic layer;
- applying liberal amounts of unset, thermal conductive adhesive to each of the heat producing bodies;
- positioning the heat sink and the common support so that the adhesive on each of the heat producing bodies is in direct contact with the grease layer on the heat sink;
- drawing the heat sink and the support together to insure a good abutting relationship between the adhesive on each heat producing body and the grease layer; and
- allowing the adhesive to set to form a cleavable, thermal conductive connection between each of the heat producing bodies and the heat sink.

References Cited by the Examiner

UNITED STATES PATENTS

| | | | |
|---|---|---|---|
| 2,625,378 | 1/1953 | Nason | 165—136 |
| 2,949,283 | 8/1960 | Smith | 165—180 |
| 2,965,819 | 12/1960 | Rosenbaum | 165—185 |
| 3,103,587 | 9/1963 | Ure et al. | 62—3 X |

ROBERT A. O'LEARY, *Primary Examiner.*

C. SUKALO, *Assistant Examiner.*